United States Patent
Yu et al.

(10) Patent No.: US 8,847,333 B2
(45) Date of Patent: Sep. 30, 2014

(54) TECHNIQUES PROVIDING METAL GATE DEVICES WITH MULTIPLE BARRIER LAYERS

(75) Inventors: Xiong-Fei Yu, Hsinchu (TW); Chun-Yuan Chou, Taipei (TW); Da-Yuan Lee, Jhubei (TW); Kuang-Yuan Hsu, Fongyuan (TW); Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 97 days.

(21) Appl. No.: 13/224,033

(22) Filed: Sep. 1, 2011

(65) Prior Publication Data

US 2013/0056836 A1    Mar. 7, 2013

(51) Int. Cl.
| | |
|---|---|
| *H01L 29/76* | (2006.01) |
| *H01L 29/51* | (2006.01) |
| *H01L 21/28* | (2006.01) |
| *H01L 21/8238* | (2006.01) |
| *H01L 29/49* | (2006.01) |
| *H01L 29/66* | (2006.01) |
| *H01L 29/165* | (2006.01) |
| *H01L 29/78* | (2006.01) |

(52) U.S. Cl.
CPC ........ *H01L 29/66545* (2013.01); *H01L 29/517* (2013.01); *H01L 21/28088* (2013.01); *H01L 21/823814* (2013.01); *H01L 29/165* (2013.01); *H01L 21/823842* (2013.01); *H01L 21/823807* (2013.01); *H01L 29/4966* (2013.01); *H01L 29/7848* (2013.01); *H01L 29/6659* (2013.01)
USPC .................. 257/410; 257/751; 257/E21.409; 257/E21.584; 257/E29.242

(58) Field of Classification Search
USPC .................. 257/410, 751, E21.409, E21.584, 257/E29.242
See application file for complete search history.

(56) References Cited

U.S. PATENT DOCUMENTS

| 8,426,300 B2 * | 4/2013 | Ramachandran et al. .... 438/586 |
| 2010/0065925 A1 | 3/2010 | Huang et al. |

* cited by examiner

*Primary Examiner* — Andy Huynh
(74) *Attorney, Agent, or Firm* — Haynes and Boone, LLP

(57) ABSTRACT

A semiconductor device with a metal gate is disclosed. An exemplary semiconductor device with a metal gate includes a semiconductor substrate, source and drain features on the semiconductor substrate, a gate stack over the semiconductor substrate and disposed between the source and drain features. The gate stack includes a HK dielectric layer formed over the semiconductor substrate, a plurality of barrier layers of a metal compound formed on top of the HK dielectric layer, wherein each of the barrier layers has a different chemical composition; and a stack of metals gate layers deposited over the plurality of barrier layers.

20 Claims, 11 Drawing Sheets

TECHNIQUES PROVIDING METAL GATE DEVICES WITH MULTIPLE BARRIER LAYERS

BACKGROUND

As technology nodes shrink, in some IC designs, there has been a desire to replace the traditional polysilicon gate electrode with a metal gate electrode to improve device performance with the decreased feature sizes. Providing metal gate structures (e.g., including a metal gate electrode rather than polysilicon) offers one solution. One process of forming a metal gate stack is termed a "gate last" process in which the final gate stack is fabricated "last" which allows for a reduced number of subsequent processes, including high temperature processing, that are performed before formation of the gate stack. Additionally, as the dimensions of transistors decrease, the thickness of the gate oxide may be reduced to maintain performance with the decreased gate length. In order to reduce gate leakage, high dielectric constant (high-k or HK) gate insulator layers are also used which allows to maintain the same effective thickness as would be provided by a typical gate oxide used in larger technology nodes.

However, when a high k dielectric material and a metal are adopted to form a gate stack, various issues may arise when integrating the processes and materials for this purpose. For example, device reliability issues may be induced by properties of a barrier layer (sometimes referred to as a "cap layer") between a high k dielectric material and a metal. In another example, it can be challenging to tune the work functions for NMOS transistor and PMOS transistors independently and properly.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

Figure 1:
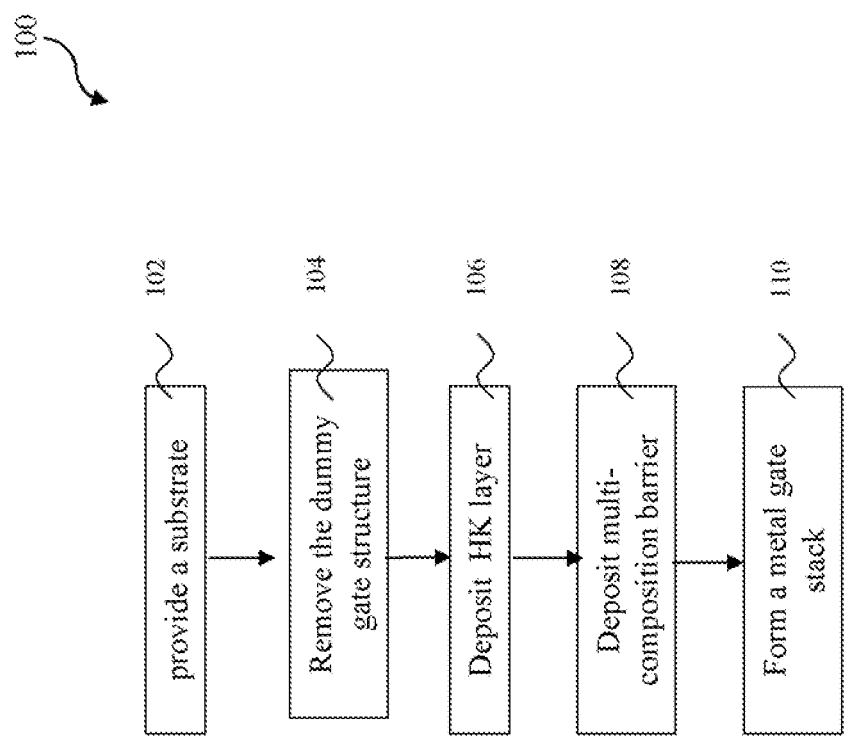
FIG. 1 is a flowchart of an example method for making a semiconductor device having a HK last/metal gate (MG) last structure constructed according to various aspects of the present disclosure.

One of the broader forms of the present disclosure involves a semiconductor device with a metal gate. An exemplary semiconductor device includes a semiconductor substrate, a HK dielectric layer formed over the semiconductor substrate, a plurality of barrier layers of a metal compound formed on top of the HK dielectric layer, wherein each of the barrier layers has a different chemical composition; and a stack of metals gate layers deposited over the multiple barrier layers.

Another one of the broader forms of an embodiment of the present disclosure involves a semiconductor device with a metal gate that includes a semiconductor substrate, an interfacial layer formed over the semiconductor substrate, a HK dielectric layer formed over the interfacial layer, a first barrier layer formed over the HK dielectric layer, a second barrier layer formed over the first barrier layer, wherein the first barrier layer and second barrier layer comprise a same metal compound material, further wherein the first barrier layer and the second barrier layer have different chemical ratios, and a stack of metal gate layers deposited over the second barrier layer.

Another one of the broader forms of an embodiment of the present disclosure involves a method of fabricating a semiconductor device. The method includes providing a semiconductor substrate, depositing a high-k (HK) dielectric layer over the semiconductor substrate, depositing a first metal compound barrier layer over the HK dielectric layer, depositing a second metal compound barrier layer over the first metal compound barrier layer, wherein the first and second metal compound barrier layers are formed of a same material by different, respective deposition processes, and depositing a stack of metal gate layers over the first and second metal compound barrier layers.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

A HK Last/MG Last Process

FIG. 1 is a flowchart of one example embodiment of a method 100 for making a semiconductor device having a HK/multi-composition-barrier/metal gate stack constructed according to various aspects of the present disclosure. The method 100 is described with reference to FIGS. 2 through 6. A HK last/MG last process scheme means that a HK layer and metal gate are formed after high temperature processes have been applied in formations of, such as source and drain regions. HK last process scheme may improve the device reliability and mobility at scaled effective oxide thickness (EOT), which can be significantly degraded when the HK dielectric has gone through the high temperature thermal steps.

The method 100 begins at step 102 by providing a semiconductor substrate 210. The substrate 210 includes silicon. Alternatively, the substrate may include germanium, silicon germanium, gallium arsenide or other appropriate semiconductor materials. Also alternatively, the semiconductor substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and materials.

Figure 2:
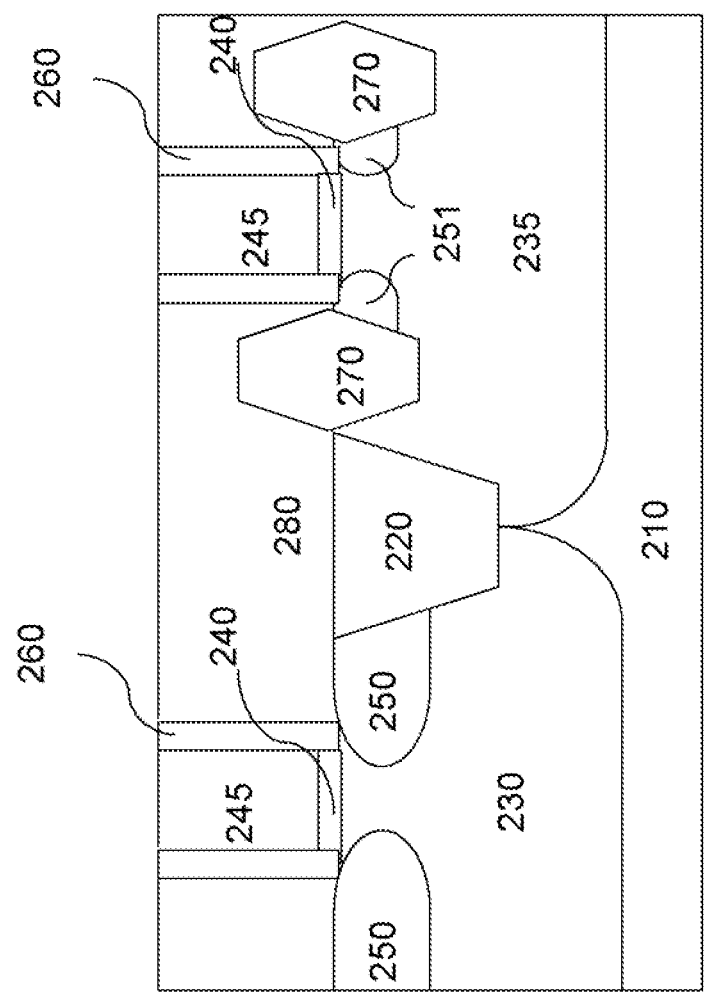
FIGS. 2 to 6 are sectional views of an example embodiment of a semiconductor device having HK last/metal gate last structure at fabrication stages constructed according to various aspects of the present disclosure.

In FIG. 2, the substrate 210 also includes various isolation features and the isolation features may include different structures and can be formed using different processing technologies. For example, an isolation feature may include shallow trench isolation (STI) feature 220. The formation of STI may include etching a trench (not shown) in substrate 210 and filling the trench by insulator materials such as silicon oxide, silicon nitride, or silicon oxynitride. The filled trench may have a multi-layer structure such as a thermal oxide liner layer with silicon nitride filling the trench. As an example, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back excessive oxide.

In FIG. 2, various doped regions such as a P-well 230, a N-well 235 are formed by implantation techniques. Any appropriate implantation techniques now known or later developed may be used.

A dummy oxide 240, such as SiO2 or SiON, is disposed over the substrate 210 by thermal oxidation, chemical oxidation, CVD, ALD or any appropriate method. Thereafter, the dummy gate layer 245, such as polysilicon, is disposed over the dummy oxide 240 by CVD technique. Then the dummy oxide 240 and the dummy gate layer 245 are patterned to form a dummy gate stack.

Additionally or alternatively, doped source/drain regions, 250 in P-well and 251, in N-well, are formed by various ion implantation processes and are aligned with the dummy gate stacks. N-type dopant impurities employed to form the associated doped regions may include phosphorus, arsenic, and/or other materials. P-type dopant impurities may include boron, indium, and/or other materials. Furthermore, in some embodiments source and drain region 250, 251 may include such as lightly doped drain (LDD), heavily doped source and drain portions and may also include salicide for reduced contact resistance. Whereas in some embodiments, N-type source and drain regions may use silicon epitaxial growth layer with lightly doped phosphorous, heavily doped phosphorous, lightly doped carbon, or both.

After formation of the source and drain (S/D) regions, 250 and 251, one or more annealing processes may be performed to activate the S/D regions. The annealing processes comprise rapid thermal annealing (RTA), laser annealing processes, or other suitable annealing processes. As an example, a high-temperature thermal annealing step that may apply temperatures anywhere in the range of 900 C-1100 C, though other embodiments may use temperatures within a different range. As another example, high-temperature annealing includes thermal processes with temperatures above 600 C. Further, this embodiment may include a "spike" annealing process that has a very short time duration.

Gate spacers 260 are formed afterward by dielectric deposition and dry etching process. After spacer 260 is formed, an epitaxial growth process is used to create regions 270. For instance, an etch process may be used to recess the substrate 210, and the epitaxial growth processes may be used to grow regions 270. Regions 270 are in the PFET device and include SiGe. However, other suitable materials may be used by different embodiments. In one embodiment, additionally an epitaxial growth region of silicon carbide (SiC) may be formed in NFET (not shown). In another embodiment, after the formation of spacer 260, heavily doped source and drain portions may be formed by implantation techniques.

An inter-layer dielectric (ILD) 280 is formed on the semiconductor substrate and the dummy gate stacks. A chemical mechanical polishing (CMP) process is performed to remove the ILD 280 such that the dummy gate layer 245 is exposed. Additionally or alternatively, a hard mask may be formed on the dummy gate layer 245. The CMP process is applied to expose the hard mask and then an etching process such as a wet etch dip is applied to remove the hard mask, exposing the dummy gate layer 245.

Figure 3:
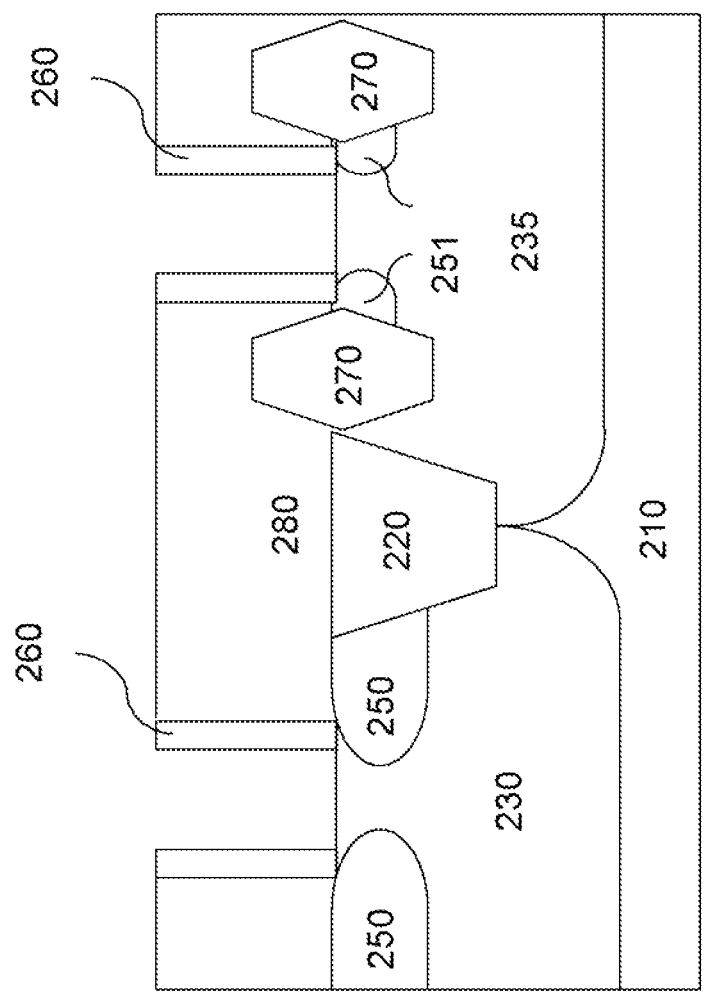

The method 100 proceeds to step 104 by applying an etching process to remove the dummy gate layer 245 in both the NFET and PFET, forming gate trenches in the NFET regions and PFET regions, as shown in FIG. 3. The etch technique may include dry etch, wet etch, or a combination of dry and wet etch. In some instances, dummy gate layer 245 is formed on top of the dummy oxide 240. In such instances, the dummy oxide 240 may also be removed using, e.g., HF wet etching or other suitable process after the dummy gate layer 245 is removed to expose the substrate surface.

Figure 4:
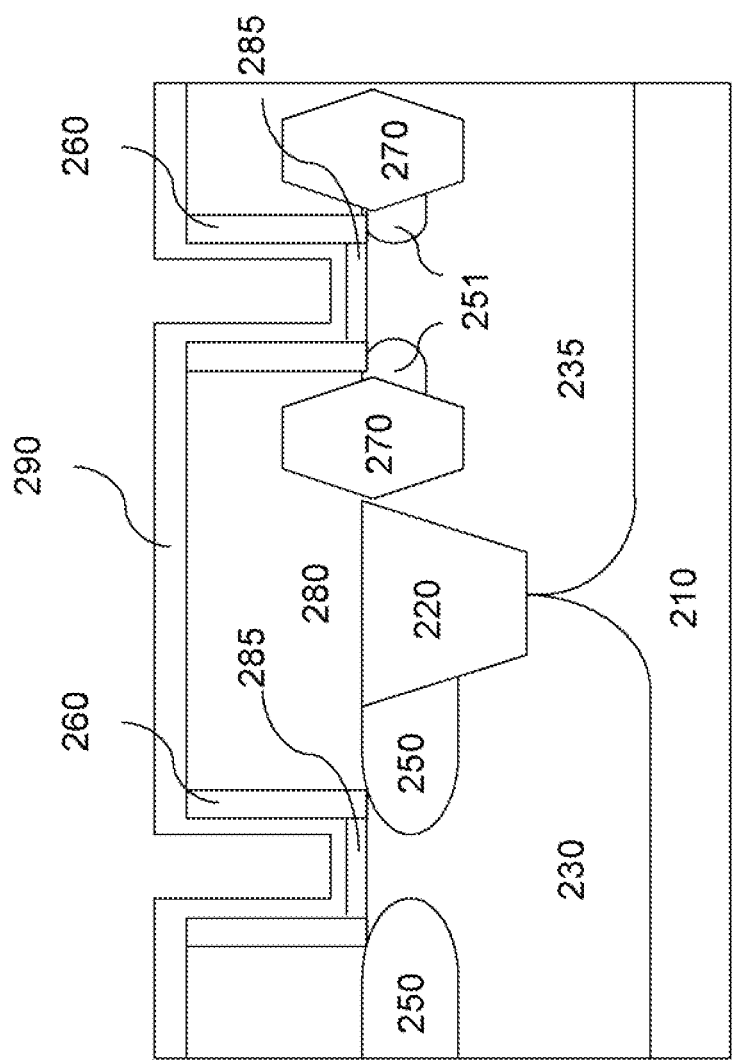

The method 100 proceeds to step 106 by depositing and annealing a HK dielectric material layer 290 on the gate trench and may additionally include a thin silicon oxide or SiON 285 underlying the HK dielectric material layer, as shown in FIG. 4. The HK dielectric material layer 290 may include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The HK material layer 290 may be deposited by chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. In the depicted embodiment, the HK layer 290 includes HfO2 and is deposited by ALD. The interfacial layer 285, interposed between the semiconductor substrate and the HK layer 290, can be silicon oxide and may be formed by various suitable methods such as thermal oxidation, ALD or UV-Ozone Oxidation. In many instances, addition of interfacial layers (ILs) between the HK film and the substrate surface has proven to be beneficial to gate stack electrical performance. Interfacial layers may be important as diffusion barriers, preventing undesirable interface reactions between HK dielectric material and the substrate. A post HK layer deposition annealing may be performed to enhance moisture control in gate dielectrics.

Figure 5:
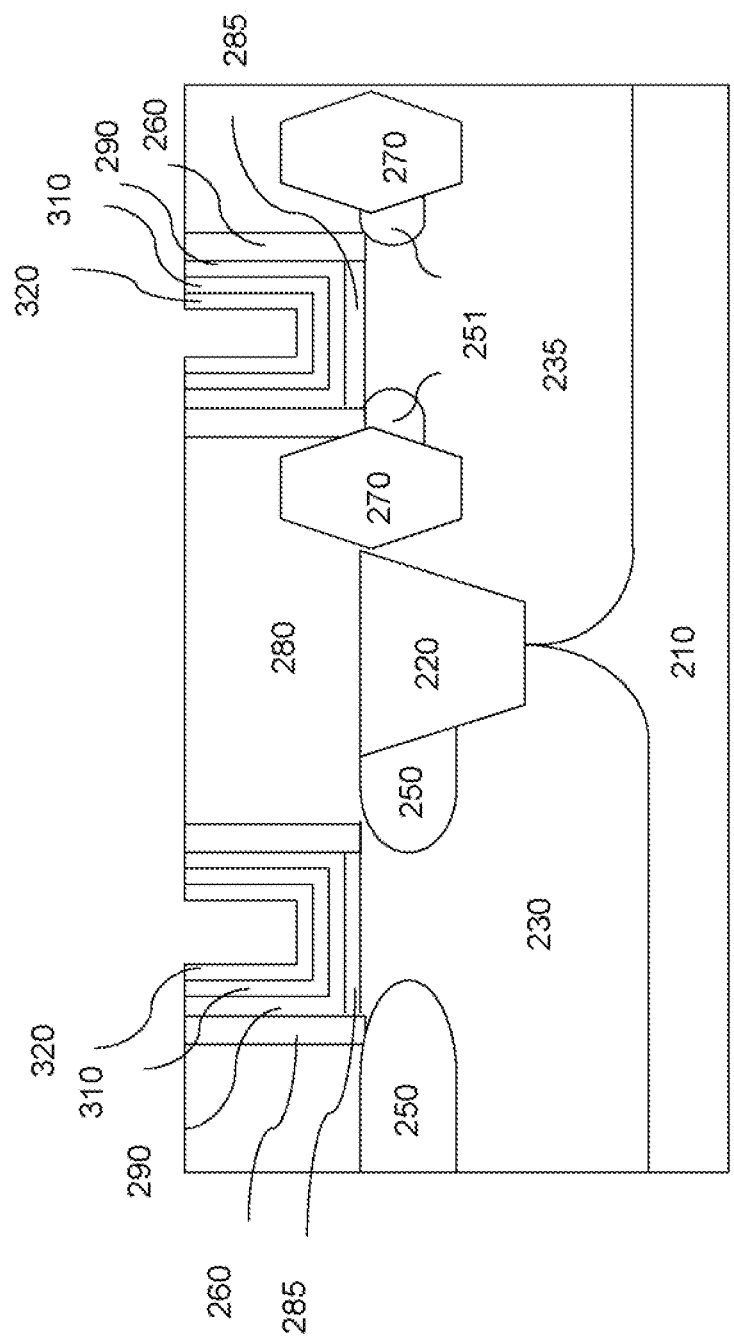

The method 100 proceeds to step 108 by depositing a multi-composition-layer barrier layer, 310 and 320 over the HK layer as shown in FIG. 5. In this example, the metal barrier layers 310 and 320 conduct electricity and prevent inter-diffusion and reaction between metals, silicon or dielectric materials. The candidates for a metal barrier material may include refractory metals and their nitrides (e.g. TiN, TaN, W2N, TisiN, TaSiN). A metal barrier layer may be deposited by physical vapor deposition (PVD), chemical vapor deposition (CVD), Metal-organic chemical vapor deposition (MOCVD) and atomic layer deposition (ALD).

PVD is a deposition method which involves physical processes such as a plasma sputter bombardment rather than involving a chemical reaction at the surface. In the plasma sputter process, atoms or molecules are ejected from a target material by high-energy particle bombardment so that the ejected atoms or molecules can condense on a substrate as a thin film. A composition of the deposited film can be varied by deposition condition, such as a ratio of the ejected atoms or molecules. ALD is a gas phase chemical process and it is a self-limiting atomic layer-by-layer growth method. The surface-controlled growth mechanism of ALD provides good step coverage and dense films with few (or no) pinholes. The precision achieved with ALD allows processing of extremely thin films in a controlled way in the nanometer scale. As a chemical reaction process, the composition of the deposited film in an ALD method is decided by a chemical reaction itself, and the composition is not as easily adjusted as in the PVD process. As an example, ALD TiN typically provides a fixed 1:1 ratio of Ti:N, whereas PVD TiN typically provides an adjustable ratio of Ti:N.

Diffusion properties of a barrier varies with the stoichiometry of the material and the deposition method applied. Diffusion properties impact the performance of the device. For example, a nitride-rich (a ratio of N to Ti>1) TiN barrier for Al metal is more efficient to prevent Al diffusion into the HK dielectric, where such diffusion is believed to contribute to a device reliability issue—time-dependent dielectric breakdown (TDDB). A nitride-rich TiN is usually more thermal stable than a TiN with 1:1 ratio of Ti:N. The deposition method may also impact the underlaying material. As an example, when a barrier is deposited on top of a HK material by a PVD method, the HK material may be exposed to high-energy particle bombardment (plasma damage). The HK layer may suffer the plasma damage and an excessive N incorporation during sputtering, which may degrade the HK layer's reliability, such as causing negative bias temperature instability (NBTI).

In the depicted embodiment, a metal barrier includes a first barrier layer 310 by ALD and a second barrier layer 320 by PVD. In furtherance of the embodiment, a metal barrier includes a multi-composition-layer 310 and 320. The barrier layer 310 includes ALD TiN with a 1:1 ratio of Ti:N and the barrier layer 320 includes PVD TiN with a ratio range of about 1:1.6 to 1:3 of Ti:N (though any appropriate ratio may be used). The barrier layer 310 is deposited on top of the HK layer 290. By using an ALD deposition method, the HK layer 290 does not experience a high-energy particle bombardment during the deposition of the barrier layer 310. The barrier layer 320, shown in FIG. 6 under a work function (WF) metal gate (MG) stack, 350A, in NFET and 350B in PFET, is deposited by a PVD technique to achieve a desired stoichiometry of TiN by choosing an appropriate nitrogen flow during the PVD deposition process. An example total thickness of the multi-composition barrier layer 310 and 320 is 5 to 50 A, and the ratio of the thickness of the barrier layer 310 to the barrier layer 320 can vary between embodiments. Thus, in some examples, a thickness ratio of the barrier layer 310 to the barrier layer 320 may be 1:1, though non-1:1 ratio may be used, and thickness ratios can by changed from batch to batch. Alternatively, the barrier layer 320 may be deposited by CVD, MOCVD and the barrier layer 310 may be deposited by remote plasma CVD (RPCVD) or any appropriate plasma-damage-free deposition techniques. Also, the barrier layer may include three barrier layers by using ALD, PVD, CVD and/or any appropriate method.

Figure 6:
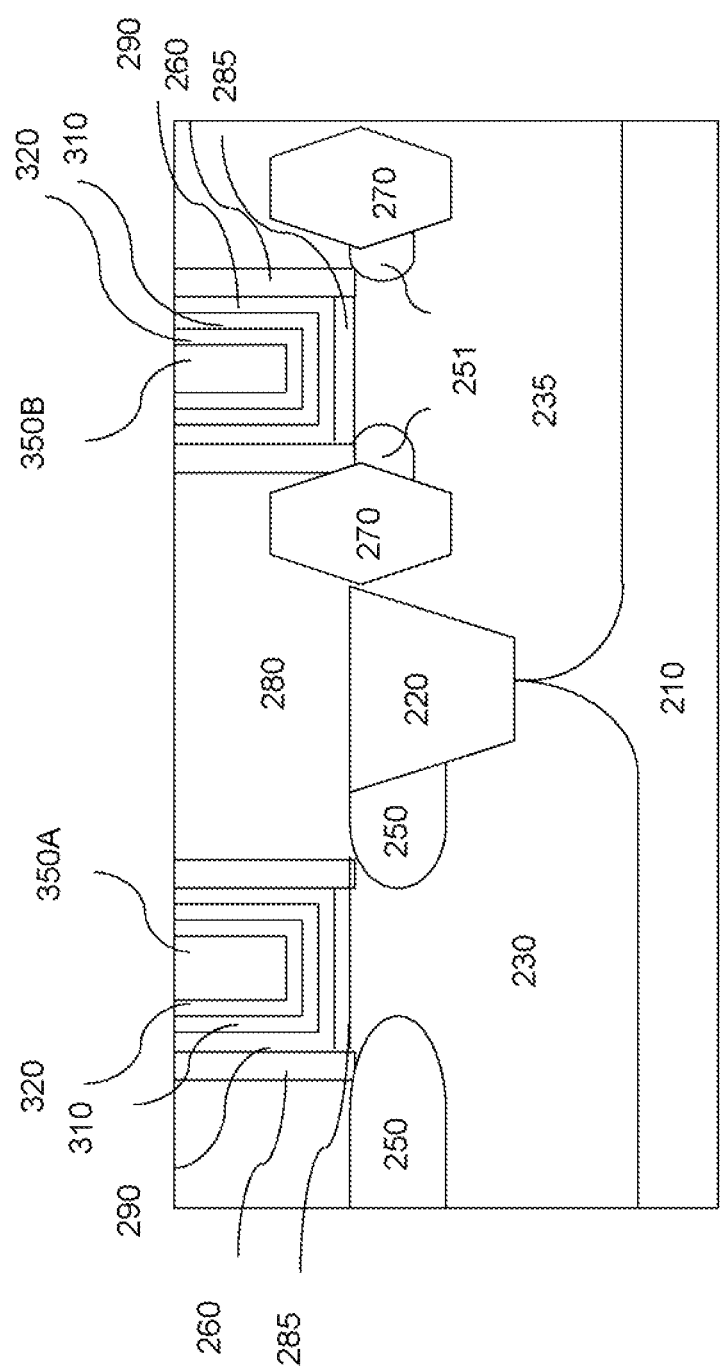

Continuing with FIG. 6, the method 100 proceeds to step 110 by forming N-type metal gate (MG) stacks 350A and P-type MG 350B, respectively in the N-type and P-type devices. The MG stacks are not exposed to high temperatures because the high-temperature annealing for the HK dielectric layer is performed before MGs are formed (called MG last). A forming of N-type MG stack 350A may include forming a tantalum nitride (TaN) layer; and forming one of a TiAl layer and a TiAlN layer on the TaN layer. The forming of P-type MG stack 350B may include forming a tantalum nitride (TaN) layer; forming a tungsten nitride (WN) layer on the TaN layer; and forming one of a TiAl layer and a TiAlN layer on the WN layer. In one embodiment, the N-type MG includes a tantalum nitride layer. The N-type metal layers additionally include a titanium aluminum (TiAl) layer or a titanium aluminum nitride (TiAlN) layer. In one embodiment, the metal layers are deposited by using a chemical vapor deposition (CVD) process or other suitable process. By the disclosed method, the metal gate stacks for NFET and PFET are formed with different compositions and configurations. The work functions for NFET and PFET regions are tuned independently. The performances of the NMOSFET and PMOSFET are optimized and enhanced.

The method 100 may include further processes, such as an additional CMP process to polish the substrate and substantially remove the excessive metal materials above the substrate surface after the previous CMP process.

The method 100 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

By applying the multi-composition TiN barriers (ALD/PVD) 310 and 320 between HK layer 290 and WF metal and metal gate stacks 350A, 350B, HK layer 290 may avoid plasma damage, and also an efficient diffusion barrier may be established for WF metal gate stack 350A, 350B. And all of these may improve NBTI and TDDB.

In the above example, two-composition barrier layer 310 and 320 are applied. Alternatively, in other embodiment, the barrier layers may include any appropriate number of layers of different composition (e.g. three or more).

HK First and MG Last Process

Figure 7:
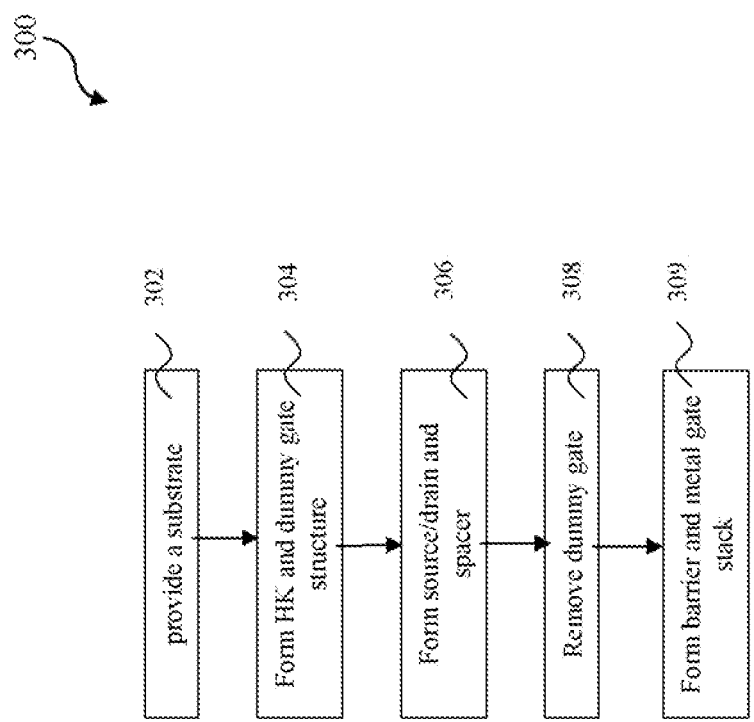
FIG. 7 is a flowchart of an example method for making a semiconductor device having a HK first/metal gate last structure constructed according to various aspects of the present disclosure.

FIG. 7 is a flowchart of one embodiment of an example method 300 making a semiconductor device having a HK first/MG last constructed according to various aspects of the present disclosure. The method 300 is described with reference to FIGS. 8 through 11.

Figure 8:
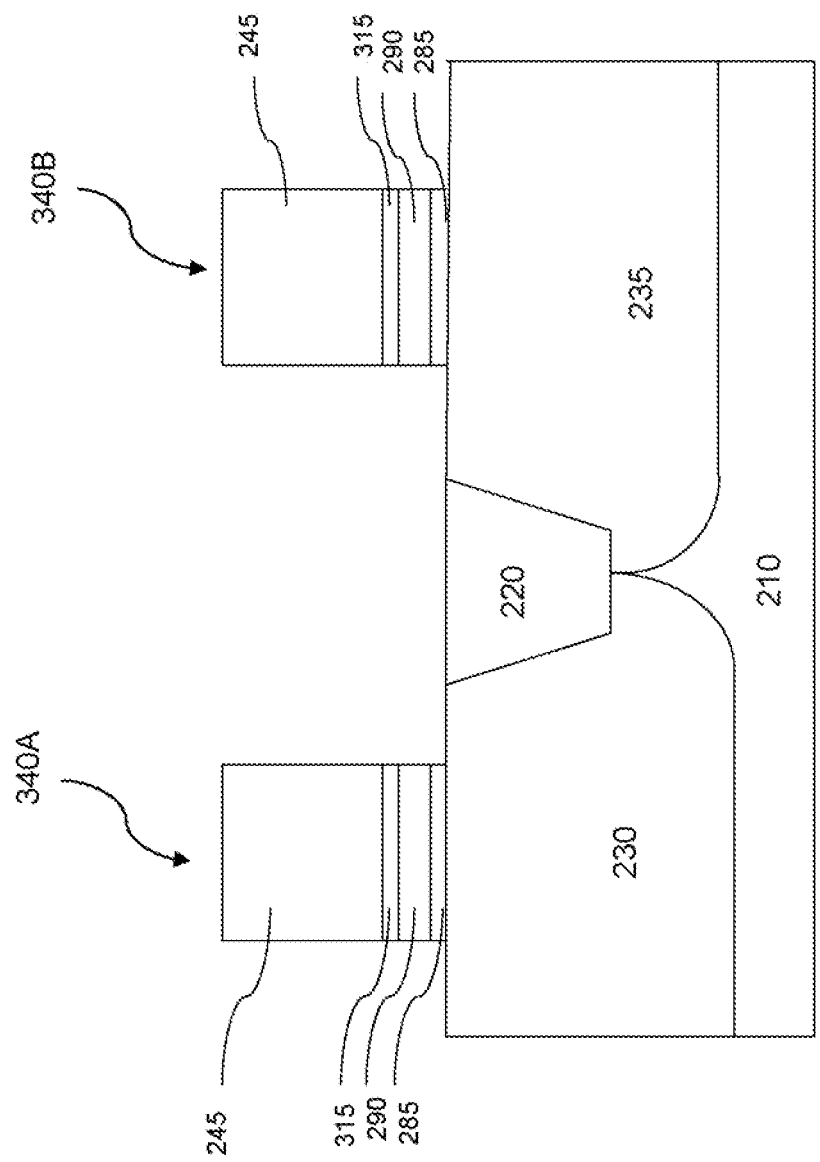
FIGS. 8 to 11 are sectional views of one embodiment of a semiconductor device having HK first/metal gate last structure at fabrication stages constructed according to various aspects of the present disclosure.

The method 300 begins at step 302 by providing a semiconductor substrate 210, as showed in FIG. 8. The substrate 210 includes a STI 220, a P-well 230, and a N-well 235. A formation of the STI 220, P-well 230 and N-well 235 is similar in many respects to FIG. 2.

The method 300 proceeds to step 304 by forming gate stacks, 340A and 340B, on the substrate 210. The gate stacks, 340A and 340B, include the IL layer 285, the HK layer 290, a etch stop layer 315, and the dummy gate layer 245. Formations of the IL layer 285, the HK layer 290, and the dummy gate layer 245 have been described in FIGS. 2 and 4. In the depicted embodiment, the etch stop layer 315 on top of the HK layer 290 includes ALD TiN. An HK first process means that a HK layer is formed before a formation of source and drain regions of NFET and PFET, in which a high temperature process is applied.

Figure 9:
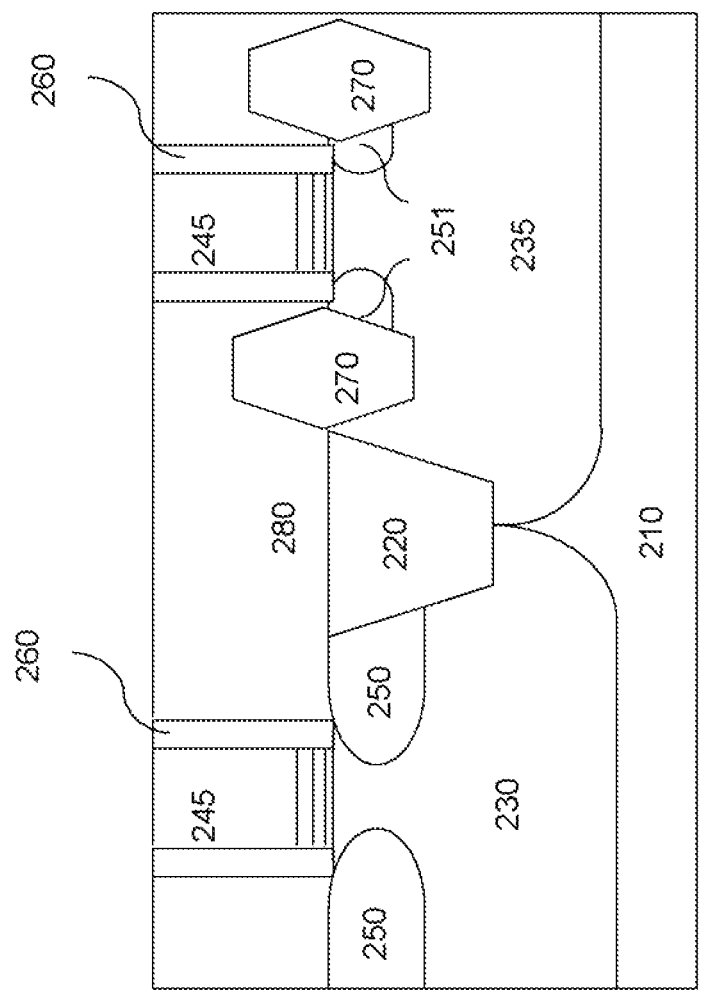

The method 300 proceeds to step 306 by forming a gate spacer 260, source/drain regions 250 of a NFET, source/drain regions 251, 270 of a PFET, and ILD layer 280, as shown in FIG. 9. The gate spacer 260, the source/drain regions 250 of the NFET, the source/drain regions 251 and 270 of the PFET, and ILD 280 are formed by techniques of depositing, etching, implant, annealing, and epitaxially growth as described above with respect to the embodiment of FIG. 2.

Figure 10:
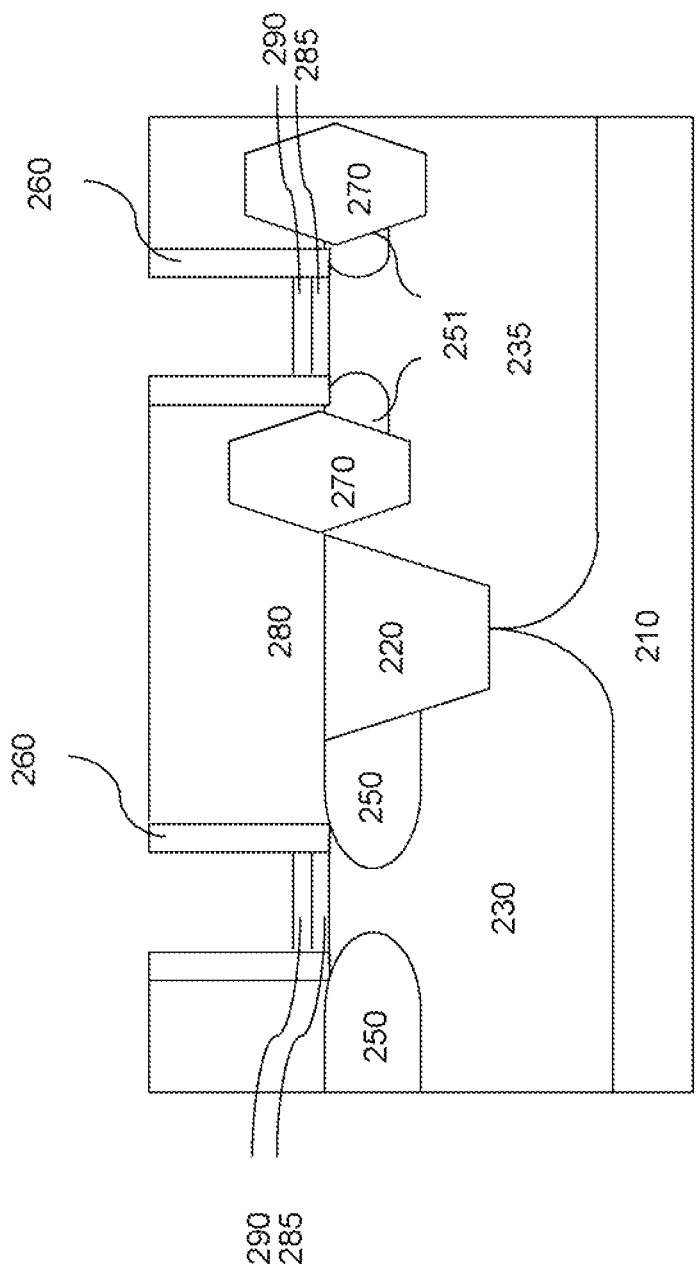

The method 300 proceeds to step 308 by removing the dummy gate layer 245 and the etch stop layer 315 as shown in FIG. 10. The removing technique may include a dry etch or a wet etch.

Figure 11:
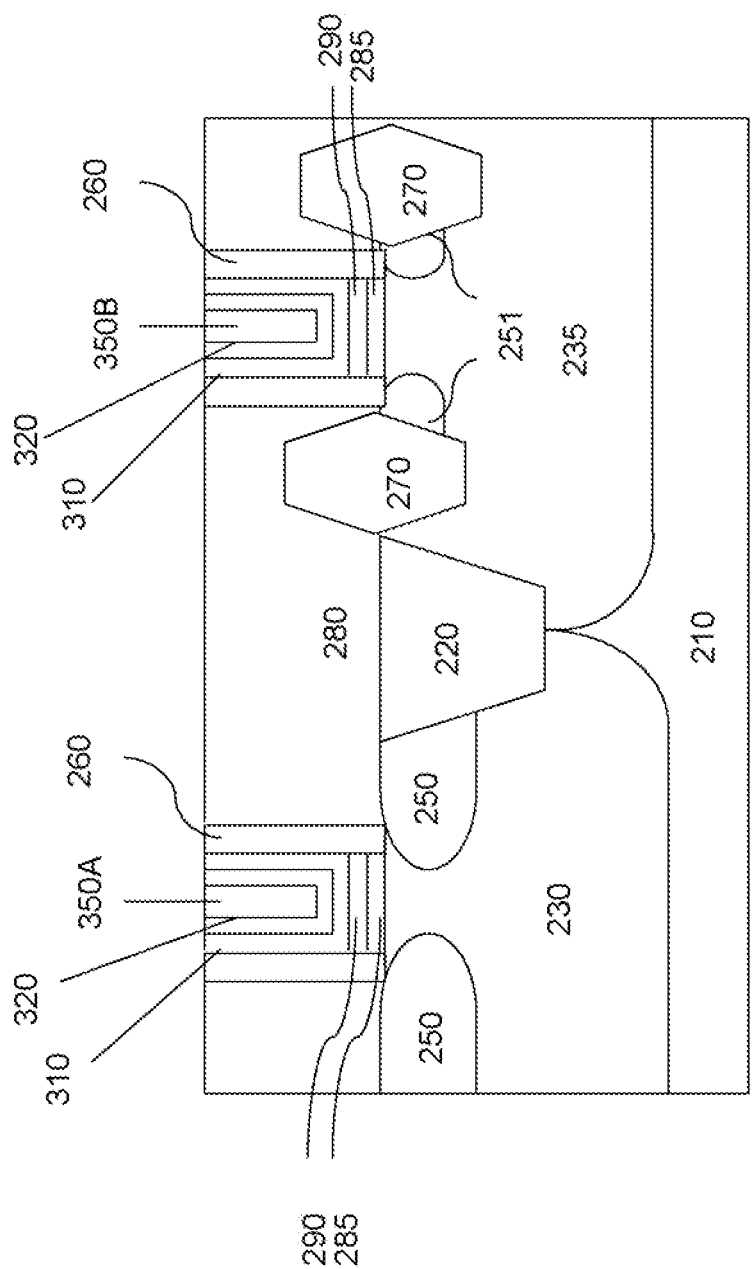

The method 300 proceeds to step 309 by forming multi-composition barrier layers, 310, 320, in a similar manner as described above with respect to FIGS. 5 and 6. The step 309 further includes forming a N-type MG stack 350A and a P-type MG stack 350B on top of the multi-composition barrier 310 and 320, as shown in FIG. 11. The formation of the N-type MG stack 350A and P-type MG stack 350B has been described above with respect to the embodiment of in FIG. 6.

In another embodiment, before depositing the dummy gate layer 245, the multi-composition barrier 310 and 320 may be deposited over the HK layer 290 to serve as an etch stop layer. The multi-composition barrier 310 and 320 may remain intact during removing process of the dummy gate layer 245.

The method 300 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

Various embodiments may include one or more advantages over single-layer barrier embodiments. As explained above, a first deposition process may be chosen so as to avoid damage to the HK layer. Thereafter, a second deposition process may be used to deposit another barrier metal layer different from the first barrier metal layer and adequately effective against diffusion. Multiple, additional barrier metal layers may also be formed as appropriate. The result is a semiconductor device with enhanced reliability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device with a metal gate comprising:
a first transistor of a first type of conductivity, the first transistor including:
a relatively-nitrogen-free high-k (HK) dielectric layer disposed over a semiconductor substrate;
an atomic layer deposition (ALD)-deposited titanium nitride barrier layer formed on top of the HK dielectric layer such that the ALD-deposited titanium nitride barrier layer physically contacts the HK dielectric layer;
a plasma-deposited titanium nitride barrier layer formed on top of the ALD-deposited titanium nitride barrier layer such that the plasma-deposited titanium nitride barrier layer physically contacts the ALD-deposited titanium nitride barrier layer; and
a first stack of metal gate layers disposed over the plasma-deposited titanium nitride barrier layer; and
a second transistor of a second type of conductivity that is opposite the first type of conductivity, the second transistor including:
the relatively-nitrogen-free high-k (HK) dielectric layer disposed over the semiconductor substrate;
the ALD-deposited titanium nitride barrier layer formed on top of the HK dielectric layer such that the ALD-deposited titanium nitride barrier layer physically contacts the HK dielectric layer;
the plasma-deposited titanium nitride barrier layer formed on top of the ALD-deposited titanium nitride barrier layer such that the plasma-deposited titanium nitride barrier layer physically contacts the ALD-deposited titanium nitride barrier layer; and
a second stack of metal gate layers disposed over the plasma-deposited titanium nitride barrier layer.

2. The semiconductor device of claim 1, wherein the first transistor further includes an interfacial layer between the substrate and the HK dielectric layer.

3. The semiconductor device claim 1, wherein the ALD-deposited titanium nitride barrier layer has 1:1 ratio of Ti:N.

4. The semiconductor device claim 3, wherein the direct-plasma-deposited titanium nitride is formed by physical-vapor-deposition (PVD).

5. The semiconductor device claim 3, wherein the PVD-deposited titanium nitride barrier layer is nitrogen-rich.

6. The semiconductor device of claim 1, wherein the first stack of metal gate layers includes a first work function metal layer of the first type physically contacting the plasma-deposited titanium nitride barrier layer, and
wherein the second stack of metal gate layers includes a second work function metal layer of the second type physically contacting the plasma-deposited titanium nitride barrier layer.

7. A semiconductor device with a metal gate comprising:
a first transistor of a first type of conductivity, the first transistor including:
an interfacial layer formed over a semiconductor substrate;
a non-plasma-damaged high-k (HK) dielectric layer disposed over the interfacial layer;
a non-direct-plasma-deposited barrier layer formed over the non-plasma-damage HK dielectric layer;
a second barrier layer formed over the non-direct-plasma-deposited barrier layer; and
a first work function metal gate layer disposed over the second barrier layer, wherein the first work function metal gate layer has the first type of conductivity and physically contacts the second barrier layer, and a second transistor of a second type of conductivity that is opposite the first type of conductivity, the second transistor including:
the non-plasma-damaged high-k (HK) dielectric layer disposed over the semiconductor substrate;
the non-direct-plasma-deposited barrier layer formed over the non-plasma-damage HK dielectric layer;
the second barrier layer formed over the non-direct-plasma-deposited barrier layer; and
a second work function metal gate layer disposed over the second barrier layer, wherein the second work function metal gate layer has the second type of conductivity and physically contacts the second barrier layer.

8. The semiconductor device of claim 7, wherein the non-direct-plasma-deposited barrier layer comprises titanium nitride.

9. The device of claim 7, wherein the second barrier layer comprises titanium nitride layer with a ratio of N to Ti of greater than 1:1.

10. The semiconductor device claim 9, wherein the first work function metal gate layer includes a compound of aluminum.

11. The device of claim 7, wherein a total thickness of the non-direct-plasma-deposited and second barrier layers is in a range of 5-20 A 5 Å-20 Å.

12. The semiconductor device claim 7, wherein non-direct-plasma-deposited barrier layer is formed by atomic-layer-deposition (ALD).

13. The semiconductor device claim 7, wherein non-direct-plasma-deposited barrier layer is formed by remote chemical vapor deposition.

14. The device of claim 7, wherein the second barrier layer is formed by physical-vapor-deposited (PVD).

15. The semiconductor device of claim 7, wherein the non-direct-plasma-deposited barrier layer of the first and second transistors includes a first titanium nitride layer with a ratio of N to Ti of about 1:1; and
wherein the second barrier layer of the first and second transistors includes a second titanium nitride layer with a ratio of N to Ti of greater than 1:1.

16. The semiconductor device of claim 15, wherein the first titanium nitride layer of the first and second transistors, respectively, physically contacts the non-plasma-damage HK dielectric layer of the first and second transistors, respectively.

17. A semiconductor device with a metal gate comprising:
a first transistor of a first type of conductivity, the first transistor including:
an interfacial layer formed over a semiconductor substrate;
a non-excessive-nitrogen-containing high-k (HK) dielectric layer disposed over the interfacial layer;
a non-direct-plasma-deposited metal-nitride barrier layer formed over the non-excessive-nitrogen-containing HK dielectric layer, the non-direct-plasma-deposited metal-nitride barrier layer having a first ratio of nitride to metal, the non-direct-plasma-deposited metal-nitride barrier layer physically contacts the non-excessive-nitrogen-containing HK dielectric layer;
a second metal-nitride barrier layer formed over the non-direct-plasma-deposited metal-nitride barrier layer, the second metal-nitride barrier layer having a second ratio of nitride to metal which is larger than the first ratio, the second metal-nitride barrier layer physically contacting the non-direct-plasma-deposited metal-nitride barrier layer; and
a stack of metal gate layers disposed over the second metal-nitride barrier layer;
a second transistor of a second type of conductivity that is opposite the first type of conductivity, the second transistor including:
the non-excessive-nitrogen-containing HK dielectric layer disposed over the semiconductor substrate;
the non-direct-plasma-deposited metal-nitride barrier layer formed over the non-excessive-nitrogen-containing HK dielectric layer, the non-direct-plasma-deposited metal-nitride barrier layer having the first ratio of nitride to metal, the non-direct-plasma-deposited metal-nitride barrier layer physically contacts the non-excessive-nitrogen-containing HK dielectric layer; and
the second metal-nitride barrier layer formed over the non-direct-plasma-deposited metal-nitride barrier layer, the second metal-nitride barrier layer having the second ratio of nitride to metal which is larger than the first ratio, the second metal-nitride barrier layer physically contacting the non-direct-plasma-deposited metal-nitride barrier layer.

18. The device of claim 17, wherein the non-direct-plasma-deposited metal-nitride barrier layer includes titanium nitride with the first ratio of nitride to titanium, wherein the first ratio is about 1:1.

19. The device of claim 18, wherein the second metal-nitride barrier layer includes titanium nitride with the second ratio of nitride to titanium in a range of 1.6:1 to 3:1.

20. The device of claim 17, wherein a total thickness of the non-direct-plasma-deposited and the second metal-nitride barrier layers is in a range of 5-20 Å.

* * * * *